(12) United States Patent
Amthor et al.

(10) Patent No.: US 12,196,832 B2
(45) Date of Patent: Jan. 14, 2025

(54) MAGNETIC RESONANCE FINGERPRINTING QUALITY ASSURANCE

(71) Applicant: KONINKLIJKE PHILIPS N.V., Eindhoven (NL)

(72) Inventors: Thomas Erik Amthor, Hamburg (DE); Mariya Ivanova Doneva, Hamburg (DE); Peter Koken, Hamburg (DE); Kay Nehrke, Ammersbek (DE)

(73) Assignee: Koninklijke Philips N.V., Eindhoven (NL)

( * ) Notice: Subject to any disclaimer, the term of this patent is extended or adjusted under 35 U.S.C. 154(b) by 86 days.

(21) Appl. No.: 18/013,922

(22) PCT Filed: Jul. 1, 2021

(86) PCT No.: PCT/EP2021/068112
§ 371 (c)(1),
(2) Date: Dec. 30, 2022

(87) PCT Pub. No.: WO2022/008329
PCT Pub. Date: Jan. 13, 2022

(65) Prior Publication Data
US 2023/0288514 A1 Sep. 14, 2023

(30) Foreign Application Priority Data
Jul. 6, 2020 (EP) .................................... 20184226

(51) Int. Cl.
*G01R 33/56* (2006.01)
*G01R 33/48* (2006.01)

(52) U.S. Cl.
CPC ..... *G01R 33/5608* (2013.01); *G01R 33/4828* (2013.01)

(58) Field of Classification Search
CPC ............ G01R 33/5608; G01R 33/4828; G01R 33/561
See application file for complete search history.

(56) References Cited

U.S. PATENT DOCUMENTS

| | | | |
|---|---|---|---|
| 2012/0235678 A1 | 9/2012 | Seiberlich et al. | |
| 2016/0139227 A1* | 5/2016 | Grodzki | A61B 5/055 324/309 |

(Continued)

FOREIGN PATENT DOCUMENTS

| | | |
|---|---|---|
| EP | 2921100 A1 | 9/2015 |
| KR | 20200060102 A | 5/2020 |

OTHER PUBLICATIONS

Bhairav Bipin Mehta et al. "Image Reconstruction Algorithm for Motion Insensitive Mr Fingerprinting (Mrf)" Magnetic Resonance in Med. vol. 80, No. 6 Dec. 1, 2018, p. 2485-2500.

(Continued)

*Primary Examiner* — G. M. A Hyder

(57) ABSTRACT

Disclosed herein is a medical system (100, 300) comprising a memory (110) storing machine executable instructions (120) and an MRF scoring module (122). The MRF scoring module is configured for outputting an MRF quality score (126) in response to receiving MRF data (124) as input. The medical system further comprises a computational system (106) configured for controlling the medical system, wherein execution of the machine executable instructions causes the computational system to: receive (200) the MRF data; receive (202) the MRF quality score in response to inputting the MRF data into an MRF scoring module; append (206) the MRF quality score to the MRF data if the MRF quality score is within a predetermined range (128); and provide (208) a signal (132) if the MRF quality score is outside of the predetermined range.

19 Claims, 5 Drawing Sheets

(56) References Cited

U.S. PATENT DOCUMENTS

2017/0261578 A1   9/2017   Zhao et al.
2018/0108128 A1   4/2018   Schmidt et al.
2018/0217220 A1   8/2018   Gulani et al.

OTHER PUBLICATIONS

International Search Report and Written Opinion From PCT/EP2021/068112 Mailed Aug. 26, 2021.

* cited by examiner

MAGNETIC RESONANCE FINGERPRINTING QUALITY ASSURANCE

CROSS REFERENCE TO RELATED APPLICATIONS

This application is a U.S. national phase application of International Application No. PCT/EP2021/068112 filed on Jul. 1, 2021, which claims the benefit of EP application Ser. No. 20/184,226.7 filed on Jul. 6, 2020 and is incorporated herein by reference.

FIELD OF THE INVENTION

The invention relates to Magnetic Resonance Imaging, in particular to magnetic resonance imaging fingerprinting.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Various quantities or properties of the subject can be measured spatially using MRI. A newer MRI technique is Magnetic Resonance Fingerprinting (MRF).

MRF is a technique which allows the simultaneous measurement of MR parameters such as T1, T2, and other parameters as well as quantitative tissue properties such as the fractional quantity of different tissue types within a voxel. In MRF a pulse sequence is used where various parameters such as the flip angle, TE, and TR are systematically varied. The k-space data is repeatedly acquired during the execution of the pulse sequence and a series of images are reconstructed. A vector or "fingerprint" comprising the value of the voxel from each of the series of images is constructed. This vector or fingerprint is then compared to a dictionary of fingerprints for various MR parameters and for different tissue properties. The vector or "fingerprint" is referred to herein as MRF data. The MRF data may be either the series of images or the vector form of the data.

United States patent application publication US 2017261578 A1 discloses systems and methods for acquiring magnetic resonance fingerprinting (MRF) imaging data from a subject using a magnetic resonance imaging (MRI) system are provided. The method includes receiving an indication of an MRF imaging process to be performed by the MRI system and receiving a desired design objective for the MRF imaging process and a configuration metric associated with the MRF imaging process. The method further includes using the configuration metric to bound a variance of tissue parameter estimates associated with the MRF imaging process and determine imaging parameters that achieve the desired design objective. The method also includes performing the MRF imaging process using the determined imaging parameters to acquire MRF data using the MRI system.

The US patent application US2018/0217220 discloses a comparison to a dictionary of signal evolutions. On the basis of separate navigator data it is determined if the NMR data meet a criterion e.g. of acceptable patient respiration.

SUMMARY OF INVENTION

The invention provides for a medical system, a computer program, and a method in the independent claims. Various representative embodiments are also described below.

A drawback to MRF is that the comparison of the MRF data to the MRF dictionary can be computationally intensive. It may not always be practical to immediately reconstruct quantitative images or mappings from the MRF data while the subject is still within the MRI system being imaged. This can lead to the subject being recalled if the MRF data is in some way degraded. For example, the subject may have moved corrupting the data. By the time it is discovered that the data will not provide clinical quality images, the subject may have already left the site of the magnetic resonance imaging system.

Embodiments may provide for a means of scoring the MRF data prior to the reconstruction. This may enable the MRF data to be evaluated more quickly and may help reduce otherwise wasted magnetic resonance imaging system time. To achieve this the MRF data is input into an MRF scoring module which outputs an MRF quality score in response to inputting the MRF data. The MRF quality score may be used to annotate or label MRF data in a database if the MRF quality score is within a predetermined range. The MRF quality score could also be used to provide a signal if the MRF quality score is outside the predetermined range. The signal could for example be used to alert the operator or be integrated into a closed control loop.

As is described below, there are a variety of principles or algorithms which can be used to calculate the MRF quality score. Depending upon the time of clinical image or map being constructed different algorithms could be selected. For example, different algorithms could be selected to give an MRF quality score related to the correct positioning of the ROI, the signal to noise level, or even to the predicted presence of motion artifacts.

In one aspect the invention provides for a medical system that comprises a memory storing machine-executable instructions and an MRF scoring module. The MRF scoring module is configured for outputting an MRF quality score in response to receiving MRF data as input. The MRF quality score may for example be a numerical value that is assigned to rate the inputted MRF data. MRF stands for magnetic resonance imaging fingerprinting. In MRF a pulse sequence is constructed which varies a number of pulse sequence parameters. The k-space data is acquired at various intervals and then reconstructed into images. The MRF data may either be in the form of a series of images or else a signal, vector, or fingerprint, for each voxel constructed from the series of images. The MRF signal can then be compared to a number of dictionary entries. Various quantities such as a T1 or T2 time or even the concentration or type of material filling a voxel can also be within a magnetic resonance imaging fingerprinting dictionary. It may take a significant amount of computational power or time to match the MRF signal to an MRF dictionary. The MRF scoring module can for example be used to rate the MRF data before the complicated computational comparison between the signal and the dictionary is made.

The present invention pertains to a magnetic resonance fingerprinting (MRF) method in which MRF (k,t)-space data (MR signal evolutions) are acquired and a comparison to stored dictionary MRF datasets is made to reconstruct an image. From the voxel-wise comparison of the MRF (k,t)-space data to the dictionary datasets the tissue content of the voxels may be derived. According to the invention, an MRF quality score is returned by the MRF scoring module prior to the dictionary comparison to reconstruct the image. In a particular implementation the MRF quality score being outside a predetermined range may initiate or prompt to reacquire the MRF-space data because the MRF scoring module appears to indicate that the originally acquired MRF space data are corrupted or otherwise not suitable for the dictionary comparison. The MRF k-space data are rated before reconstruction that involves the comparison between the k-space data of the acquired signal and the dictionary. A clinical MRF image may be by matching the MRF data to the clinical MRF dictionary according to an MRF reconstruction algorithm by matching the MRF data to the clinical MRF dictionary according to an MRF reconstruction algorithm.

The magnetic resonance imaging system is configured to arrange for reconstruction of the set of magnetic resonance images from the echo signals in that reconstruction software is installed in the magnetic resonance examination system's computational system or in that the computational system has access to a remote reconstruction facility. The reconstruction software may be installed on a remote server, e.g. in the healthcare institution of even accessible to a data-network in that the reconstruction software may be available in 'the cloud', In these remote configurations the computational system is equipped with functionality to arrange for reconstruction of the set of magnetic resonance images at the remotely located reconstruction function. Moreover, reconstruction of the magnetic resonance image may be done by way of machine learning, for example by a trained neural network that may be incorporated on the computational system or may be accessible from a remote location.

The medical system further comprises a computational system that is configured for controlling the medical system. Execution of the machine-executable instructions causes the computational system to receive the MRF data. As was mentioned before this may be/is a series of images or it may be in the form of signals for each voxel. The MRF data is in image space. Execution of the machine-executable instructions further causes the computational system to receive the MRF quality score in response to inputting the MRF data into the MRF scoring module.

Execution of the machine-executable instructions further causes the computational system to append the MRF quality score to the MRF data if the MRF quality score is within a predetermined range. Execution of the machine-executable instructions further causes the computational system to provide a signal if the MRF quality score is outside of the predetermined range.

This embodiment may be beneficial because it provides for a means of ranking or rating the MRF data before the dictionary comparison is made. This for example may enable the reacquisition of the MRF data before a subject leaves the examination room. The MRF quality score can take different forms in different examples. In one example the MRF quality score could be a score for each individual voxel of the MRF data. In other examples it might be voxels for a score that is assigned to groups of voxels. For example, there might be a segmentation or a region of interest which is indicated within the MRF data.

In another embodiment the medical system further comprises a magnetic resonance imaging system. The memory further contains MRF pulse sequence commands configured for acquiring MRF k-space data according to an MRF magnetic resonance imaging protocol. Execution of the machine-executable instructions further causes the processor to acquire MRF k-space data by controlling the magnetic resonance imaging system with the MRF pulse sequence commands. Execution of the machine-executable instructions further causes the processor to reconstruct the MRF data from the MRF k-space data. In this example the medical system comprises the magnetic resonance imaging system used to acquire the MRF k-space data which is used to reconstruct the MRF data. This may be beneficial because it may augment a conventional magnetic resonance imaging system with a means of quickly evaluating the MRF data that it acquires.

In the above embodiment the medical system is a magnetic resonance imaging system. The medical system may take other forms in other examples. In one example the medical system could be a computer system or workstation that is used in a radiology department for evaluating radiological images. In other examples the medical system may be a remote or multiple computer systems that for example is used over the internet or in a cloud situation for providing image processing services.

In another embodiment execution of the machine-executable instructions further causes the computational system to control the magnetic resonance imaging system with the pulse sequence commands to reacquire the MRF k-space data if the signal is provided. That is, a reacquisition of the MRF k-space date is initiated or prompted in response to the MRF quality score being outside said predetermined range. This embodiment may be beneficial because the MRF scoring module may be used to provide a closed control loop which is able to improve the quality of the MRF data.

In another embodiment the MRF data comprises a series of complex valued images. The MRF scoring module is configured to construct a composite image by summing the series of complex valued images and provide the MRF quality score using the composite image. This embodiment may be beneficial because it may provide a very rapid and quick means for performing an initial evaluation of the MRF data.

When one looks at an individual image in the sequence of images that makes up an MRF data, typically very few details are visible and the image quality may be quite poor. Surprisingly, constructing a composite image by summing the series of complex valued images provides a composite image which may be used to evaluate a number of image parameters very rapidly. For example, segmentations can be used to determine the location of the subject within the image as well as also notice various types of magnetic resonance imaging artifacts in the image.

In another embodiment, a preview image or composite image of artificial contrast is generated by summing up all complex values of the fingerprint signals for each voxel. Summing up the values of the fingerprint signal averages out most undersampling artifacts, so that a sharp image is retrieved, although with an image contrast that cannot be interpreted directly for diagnosis. Motion artifacts will still be present in this image can be assessed automatically. The MRF scoring module is further configured to provide the MRF quality score by identifying motion artifact regions in the composite image. This task can be performed using AI-based detection and scoring of image artifacts, for example.

In another embodiment the MRF scoring module is further configured to provide the MRF quality score by identifying a desired region of interest within the composite image. For example, the composite image may have enough detail that segmentation algorithms can be applied to the composite image. This for example may enable the identification of various anatomical regions of the subject. This in turn may enable the automatic determination of a region of interest within the composite image. This for example may be useful in determining if the detail which is desired to be imaged is actually within the image. This may result in a great savings in computational time by enabling the region of interest or the position which is being imaged in the MRF pulse sequence to be adjusted and corrected. This for example may be done rapidly enough that it can be performed immediately after an examination by the subject and enable reacquisition of the MRF data if necessary.

In another embodiment the MRF data comprises phase encoding. The MRF scoring module is configured to calculate a magnetic field inhomogeneity map from the phase encoding of the MRF data. The MRF scoring module is further configured to determine inhomogeneities B0 field regions by thresholding the magnetic field inhomogeneity map. The MRF scoring module is further configured to provide the MRF quality score by correlating the inhomogeneities B0 field regions with the motion artifact regions. The pulse sequences used for performing magnetic resonance imaging fingerprinting can be modified so that they have phase encoding as one would have if one were measuring a B0 map for a conventional magnetic resonance imaging protocol. In this embodiment this is performed and this is used to identify regions where the B0 field is inhomogeneous. This may correlate to there being more artifacts in the magnetic resonance images reconstructed from the MRF data. By correlating the MRF quality score with these inhomogeneous B0 field regions it may provide a means of more accurately identifying if there will be problems later when images are reconstructed from the MRF data.

One very common implementation of MRF is based on a gradient-spoiled SSFP sequence using Fast Imaging with Steady State Precession (FISP) with spiral readout.
Using this implementation, the phase shift of all acquired values along the fingerprinting time series will depend on B0 in the same way. The average phase shift can thus serve as an estimate for B0. This value can be determined directly from the signals, without the need for dictionary matching.

In the original MRF implementation, which was based on a balanced SSFP sequence, B0 information is encoded in the phase shifts and can be extracted before dictionary matching. Here, the B0-related phase is accumulated throughout the MRF time series.

Image regions with strong magnetic field or phase fluctuations may be identified. This may be useful because the MRF post-processing could be potentially unreliable there.

In another embodiment the memory comprises an initial magnetic resonance fingerprinting dictionary. The label 'initial' is a label to identify a particular magnetic resonance fingerprinting dictionary. The MRF scoring module is configured to reconstruct an initial magnetic resonance fingerprinting image by matching the MRF data to the initial MRF dictionary according to an initial MRF reconstruction algorithm and then to provide the MRF quality score using the initial MRF image. One thing which is computationally intensive in MRF is the matching of the MRF signals to the dictionaries. In this case, the initial MRF dictionary may be a dictionary that has fewer entries. This would then mean that the matching process can proceed much more rapidly. The results may for example not be useful for clinical results, but the results may be good enough to evaluate whether the MRF data has sufficient quality to enable it to be used later to make clinical images.

In another embodiment the MRF scoring module is further configured to provide the MRF quality score by restricting the reconstruction of the initial MRF image to a predetermined parameter range and calculating the average signal-to-noise range from the initial MRF image. For example, if it is known what one is imaging or what types of tissue will be in the image, then it is likely that the various parameters which can be determined by MRF are within a predetermined range. Restricting the reconstruction of the initial MRF image to the predetermined parameter range may therefore enable a more rapid reconstruction. The signal-to-noise ratio can then be determined by comparing the values of the voxels in the MRF image to an expected range. This may then provide the signal-to-noise range directly.

In another embodiment the MRF scoring module is further configured to provide the MRF quality score by calculating an estimate of parameter values within predetermined regions of the initial MRF image. For example, the speed at which the image can be reconstructed may be increased if only a portion of the voxels are reconstructed.

In another embodiment the memory further comprises a chosen MRF dictionary with multiple dictionary entries. The MRF scoring module is configured to compute an inner product between the MRF signal for each voxel and each of the multiple dictionary entries. The MRF scoring module is further configured to provide the MRF quality score using the inner product. The MRF signal is constructed from the series of images. The MRF dictionary has for example matched different materials or tissue types with a signal that is either measured or calculated for the MRF pulse sequence that was used. A very quick numerical check is to take the inner product between the signal for each voxel and each dictionary entry. This inner product may then be a very quick measure which can inform one of what the closest match is. The MRF quality score in this example could for example be a score which identifies the closest match and it could also be a score which identifies how closely it is matched. For example, looking at what the closest match is and what the actual inner product is. If the inner product is higher then this means that it has a closer match.

The match quality can be calculated as difference of the inner product of the signal with its best match in the dictionary:

$$q=1-\langle s,d \rangle$$

where s and d are the normalized signal vector and best-matching dictionary entry, respectively. This quantity can be considered a reliability measure for the result of the fingerprinting reconstruction. For a smaller test dictionary, the value q will on average be lower than for a more densely sampled dictionary, but if the smaller dictionary represents the expected fingerprinting signal shapes sufficiently well, the measure can still be used to estimate the reliability of the results of a post-processing with a larger dictionary.

In another embodiment the MRF scoring module is configured to provide the MRF quality score as a signal-to-noise estimate calculated by applying a statistical measure to predetermined regions of the MRF data. For example, it may be known that a particular region is one particular tissue type. One can then take voxels from this one tissue type and have a reasonable expectation that they should provide very similar signals. By comparing the signals from this region one can apply statistical measure and notice how much they are varying. This may be used to provide an estimate of the signal-to-noise ratio.

In another embodiment execution of the machine-executable instructions further causes the computational system to receive an MRF scoring module configuration command with the MRF data. As was noted above, the MRF scoring module can use a variety of different means to provide a score or provide the MRF quality score. In various clinical situations different of these quantities may be useful. The providing of the MRF scoring module configuration command can be used for example to select how the MRF scoring module provides the MRF quality score. Execution of the machine-executable instructions further causes the computational system to configure an operational mode of the MRF scoring module using the MRF scoring module configuration command. In this example the operational mode would be a choice of one of the above described algorithms for providing the MRF quality score. This embodiment may be beneficial because it may provide a means of providing an MRF quality score that is meaningful for a particular clinical situation or question.

In another embodiment the medical system comprises a user interface. The signal is provided by the user interface. For example, there may be a dialogue box which appears on a graphical user interface that informs the operator that the MRF quality score is outside of a predetermined range. This for example may enable the operator to ignore the signal, reacquire the MRF k-space data, to stop the examination, or simply to accept whatever images are reconstructed and move on.

In another embodiment the memory further comprises a clinical MRF dictionary. The term 'clinical' here is used to identify a particular MRF dictionary. The clinical MRF dictionary is therefore an MRF dictionary. Execution of the machine-executable instructions further causes the computational system to reconstruct a clinical MRF image by matching the MRF data to the clinical MRF dictionary according to an MRF reconstruction algorithm if the MRF quality score is within the predetermined range. This may have the advantage that the final reconstruction is controlled by the MRF quality score. This may help to ensure that computational resources are not wasted.

The clinical MRF dictionary in some examples may have more entries than the initial MRF dictionary. In other examples, the clinical MRF dictionary has five times as many entries as the initial MRF dictionary. In other examples the clinical MRF dictionary has at least ten times as many entries as the initial MRF dictionary.

In another aspect the invention provides for a computer program comprising machine-executable instructions for execution by a computational system configured for controlling a medical system. The computer program comprises an MRF scoring module that is configured for outputting an MRF quality score in response to receive MRF data as input. Execution of the machine-executable instructions causes the computational system to receive the MRF data. Execution of the machine-executable instructions further causes the computational system to receive the MRF quality score in response to inputting the MRF data into an MRF scoring module. Execution of the machine-executable instructions further causes the computational system to append the MRF quality score to the MRF data if the MRF quality score is within a predetermined range. Execution of the machine-executable instructions further causes the computational system to provide a signal if the MRF quality score is outside of the predetermined range.

In another aspect the invention provides for a method of medical imaging. The method comprises receiving the MRF data. The method further comprises receiving the MRF quality score in response to inputting the MRF data into an MRF scoring module. The MRF scoring module is configured for outputting an MRF quality score in response to receiving MRF data as input. The method further comprises appending the MRF quality score to the MRF data if the MRF quality score is within a predetermined range. The method further comprises providing a signal if the MRF quality score is outside of the predetermined range.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices.

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a computational system of a general purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus. A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

K-space data is defined herein as being the recorded measurements of radio frequency signals emitted by atomic spins using the antenna of a Magnetic resonance apparatus during a magnetic resonance imaging scan. Magnetic resonance data is an example of tomographic medical image data.

A Magnetic Resonance Imaging (MRI) image, MR image, or magnetic resonance imaging data is defined herein as being the reconstructed two- or three-dimensional visualization of anatomic data contained within the magnetic resonance imaging data. This visualization can be performed using a computer.

BRIEF DESCRIPTION OF DRAWINGS

In the following preferred embodiments of the invention will be described, by way of example only, and with reference to the drawings in which.

DESCRIPTION OF EMBODIMENTS

Like numbered elements in these figures are either equivalent elements or perform the same function. Elements which have been discussed previously will not necessarily be discussed in later figures if the function is equivalent.

Figure 1:
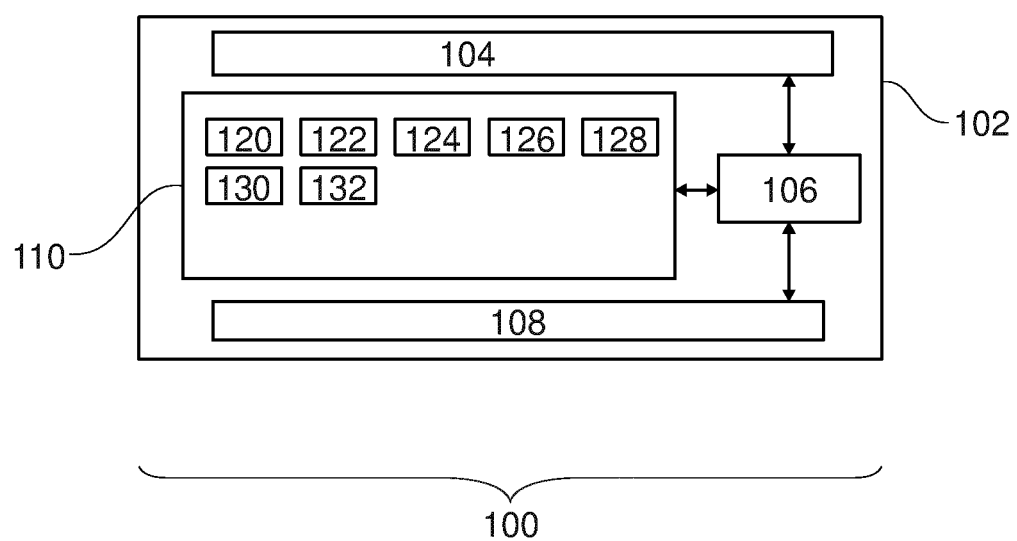
FIG. 1 illustrates an example of a medical system.

FIG. 1 illustrates an example of a medical system 100. The medical system 100 in FIG. 1 is shown as comprising a computer 102. The medical system 100 could be integrated into a variety of other systems. For example, the medical system 100 could also be incorporated into or be part of a magnetic resonance imaging system. Additionally, the medical system 100 could be a workstation type computer such as is used by a radiologist or other medical expert to examine radiological images. The medical system 100 could also be a remote or cloud-based computing system for providing image processing services.

The medical system 100 is shown as comprising a computational system 106. The computational system 106 is intended to represent one or more computing systems that may be located at one or more locations. The computational system 106 is connected to an optional hardware interface 104. If the medical system 100 comprises other components the hardware interface 104 may be used to interface the computational system 106 to these additional components. The computer 102 is further shown as comprising an optional user interface 108. The user interface 108 may provide a means for an operator or user to control and manipulate the function of the medical system 100. The computer 102 is further shown as comprising a memory 110. The memory 110 is intended to represent various types of memory which may be accessible to the computational system 106.

The memory 110 is shown as containing machine-executable instructions 120. The machine-executable instructions 120 enable the computational system comprising a processor (not shown) to control the operation and function of the medical system 100 as well as to perform various data and image processing tasks.

The memory 110 is shown as containing an MRF scoring module 122. The MRF scoring module 122 is configured for receiving MRF data 124 as an input and then outputting an MRF quality score 126. The MRF scoring module could function using a variety of different algorithms. The memory 110 is further shown as containing both the MRF data 124 and the MRF quality score 126. The memory 110 is further shown as containing a predetermined range 128. These for example may be numerical scores for particular voxels, individual voxels or statistical groups of voxels and may be compared to the MRF quality score 126. The MRF quality score 126 may also for example be a single numerical value for the entire MRF data 124.

In other examples it may be regions or sub-regions are assigned a particular MRF quality score 126. In other examples the MRF data 124 may be segmented and an MRF quality score 126 may be assigned for a particular anatomical region. In any case, the various MRF quality score 126 or scores can be compared to a predetermined range 128. If the MRF quality score 126 is within the predetermined range 128 or meets other conditions, then the MRF quality score 126 may be appended to the MRF data 124 to make an annotated MRF data 130. In case the MRF quality score or parts of the MRF quality score 126 are outside of the predetermined range 128, then a signal 132 may be produced. The signal 132 may for example be used for a control purpose, for example to control the reacquisition of magnetic resonance imaging k-space data. In yet other examples, the signal 132 may for example be used as a trigger to display a dialogue box using a graphical user interface, which may be a component of user interface 108.

Figure 2:
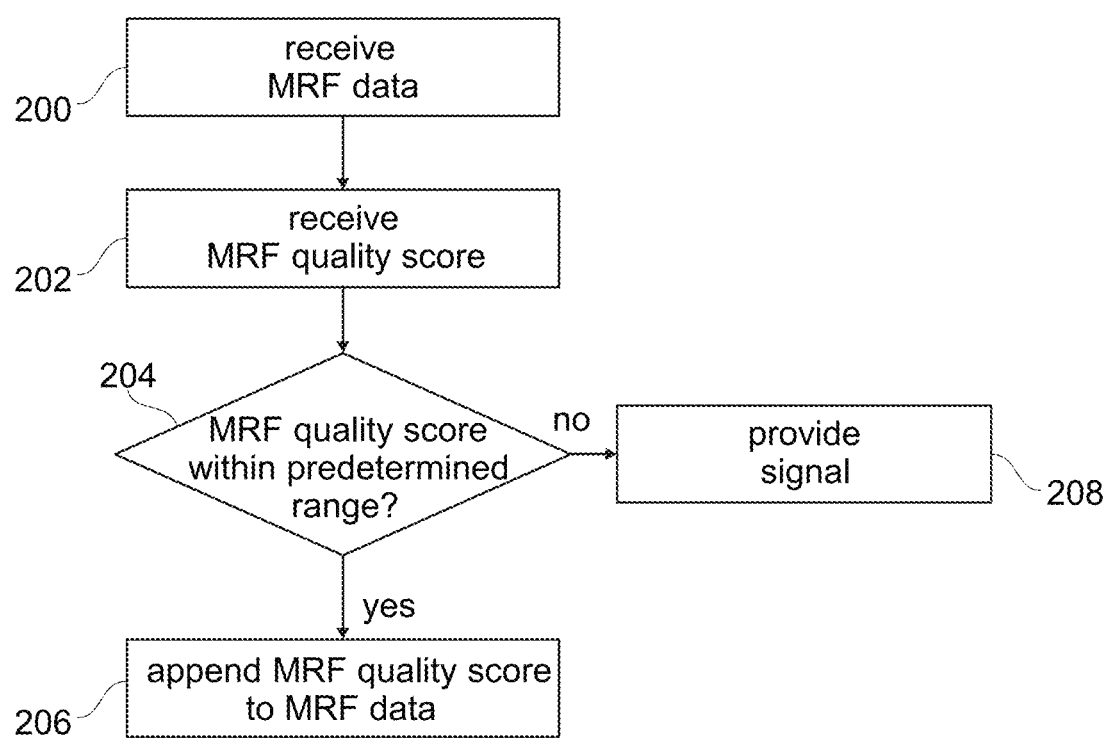
FIG. 2 shows a flow chart which illustrates a method of operating the medical system of FIG. 1.

FIG. 2 shows a flowchart which illustrates a method of operating the medical system 100 of FIG. 1. First, in step 200, the MRF data 124 is received. Next, in step 202, the MRF quality score 126 is received in response to inputting the MRF data 124 into the MRF scoring module 122. In step 206 the MRF quality score 126 is appended to the MRF data 124 if the MRF quality score 126 is within the predetermined range 128. As an alternate step, in step 208, the signal 132 is provided if the MRF quality score 126 is outside of the predetermined range 128.

Figure 3:
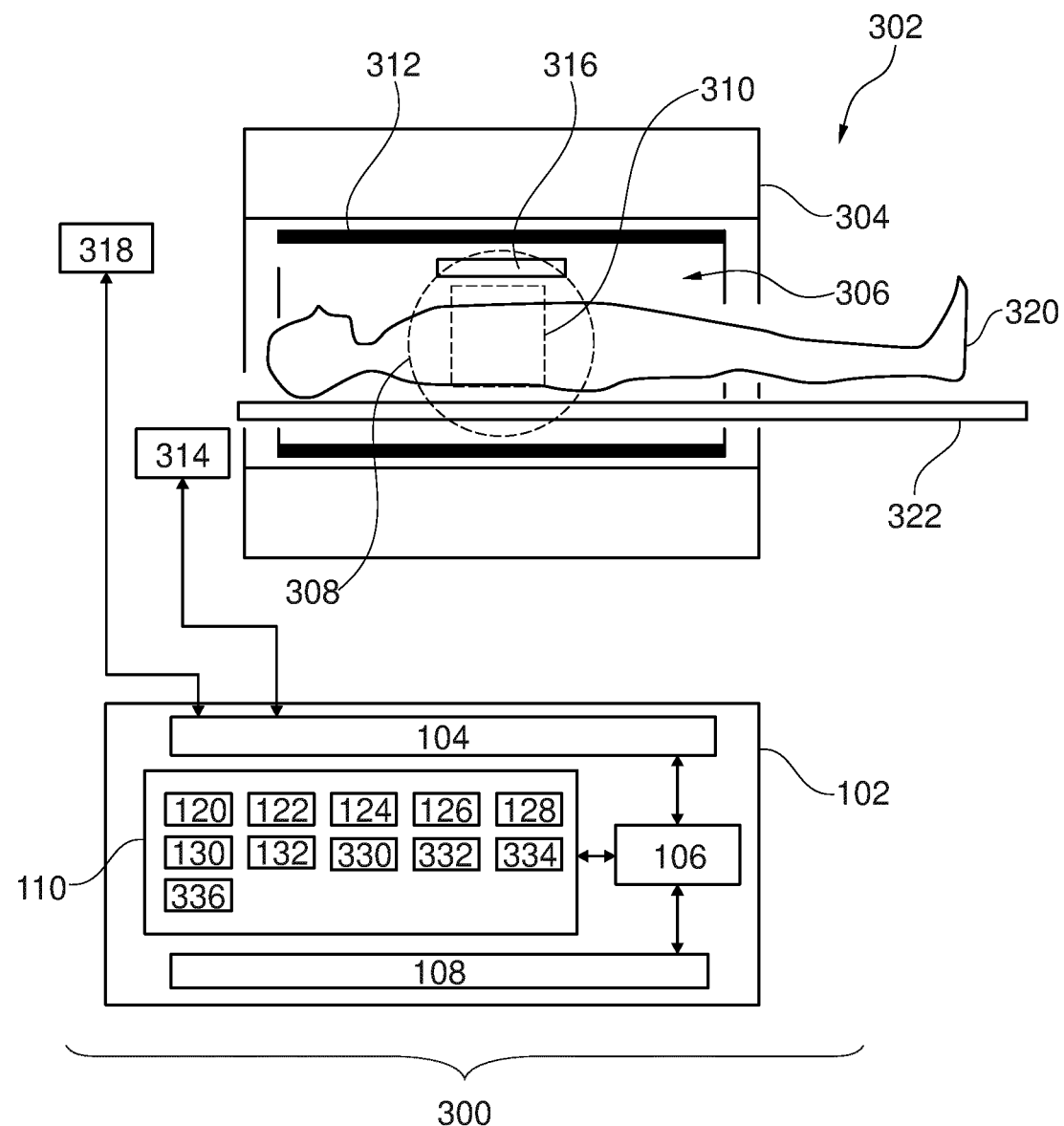
FIG. 3 illustrates a further example of a medical system.

FIG. 3 illustrates a further example of a medical system 300. The medical system 300 in FIG. 3 is similar to the medical system 100 in FIG. 1 except that it additionally comprises a magnetic resonance imaging system 302.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 306 of the cylindrical magnet 304 there is an imaging zone 308 where the magnetic field is strong and uniform enough to perform magnetic resonance imaging. A region of interest 310 is shown within the imaging zone 308. The magnetic resonance data that is acquired typically acquired for the region of interest. A subject 320 is shown as being supported by a subject support 322 such that at least a portion of the subject 320 is within the imaging zone 308 and the region of interest 310.

Within the bore 306 of the magnet there is also a set of magnetic field gradient coils 314 which is used for acquisition of preliminary magnetic resonance data to spatially encode magnetic spins within the imaging zone 308 of the magnet 304. The magnetic field gradient coils 312 connected to a magnetic field gradient coil power supply 314. The magnetic field gradient coils 312 are intended to be representative. Typically magnetic field gradient coils 312 contain three separate sets of coils for spatially encoding in three orthogonal spatial directions. A magnetic field gradient power supply supplies current to the magnetic field gradient coils. The current supplied to the magnetic field gradient coils 312 is controlled as a function of time and may be ramped or pulsed.

Adjacent to the imaging zone 308 is a radio-frequency coil 316 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 316 is connected to a radio frequency transceiver 318. The radio-frequency coil 316 and radio frequency transceiver 318 may be replaced by separate transmit and receive coils and a separate transmitter and receiver. It is understood that the radio-frequency coil 316 and the radio frequency transceiver 318 are representative. The radio-frequency coil 316 is intended to also represent a dedicated transmit antenna and a dedicated receive antenna. Likewise the radio frequency transceiver 318 may also represent a separate transmitter and receivers. The radio-frequency coil 316 may also have multiple receive/transmit elements and the radio frequency transceiver 318 may have multiple receive/transmit channels. For example if a parallel imaging technique such as SENSE is performed, the radio-frequency coil 316 will have multiple coil elements.

The transceiver 318 and the magnetic field gradient coil power supply 314 are shown as being connected to the hardware interface 104 of the computer 102.

The memory 110 is shown as containing MRF pulse sequence commands 330. The MRF pulse sequence commands 330 are according to an MRF magnetic resonance imaging protocol. The memory 110 is further shown as containing MRF k-space data 332 that has been acquired by the magnetic resonance imaging system 302 by controlling it with the MRF pulse sequence commands 330. The memory 110 is further shown as containing a clinical MRF dictionary 334. The clinical MRF dictionary 334 is an MRF dictionary. The memory 110 is further shown as containing a clinical MRF image 336 that has been reconstructed from the MRF data 124 using the clinical MRF dictionary 334.

Figure 4:
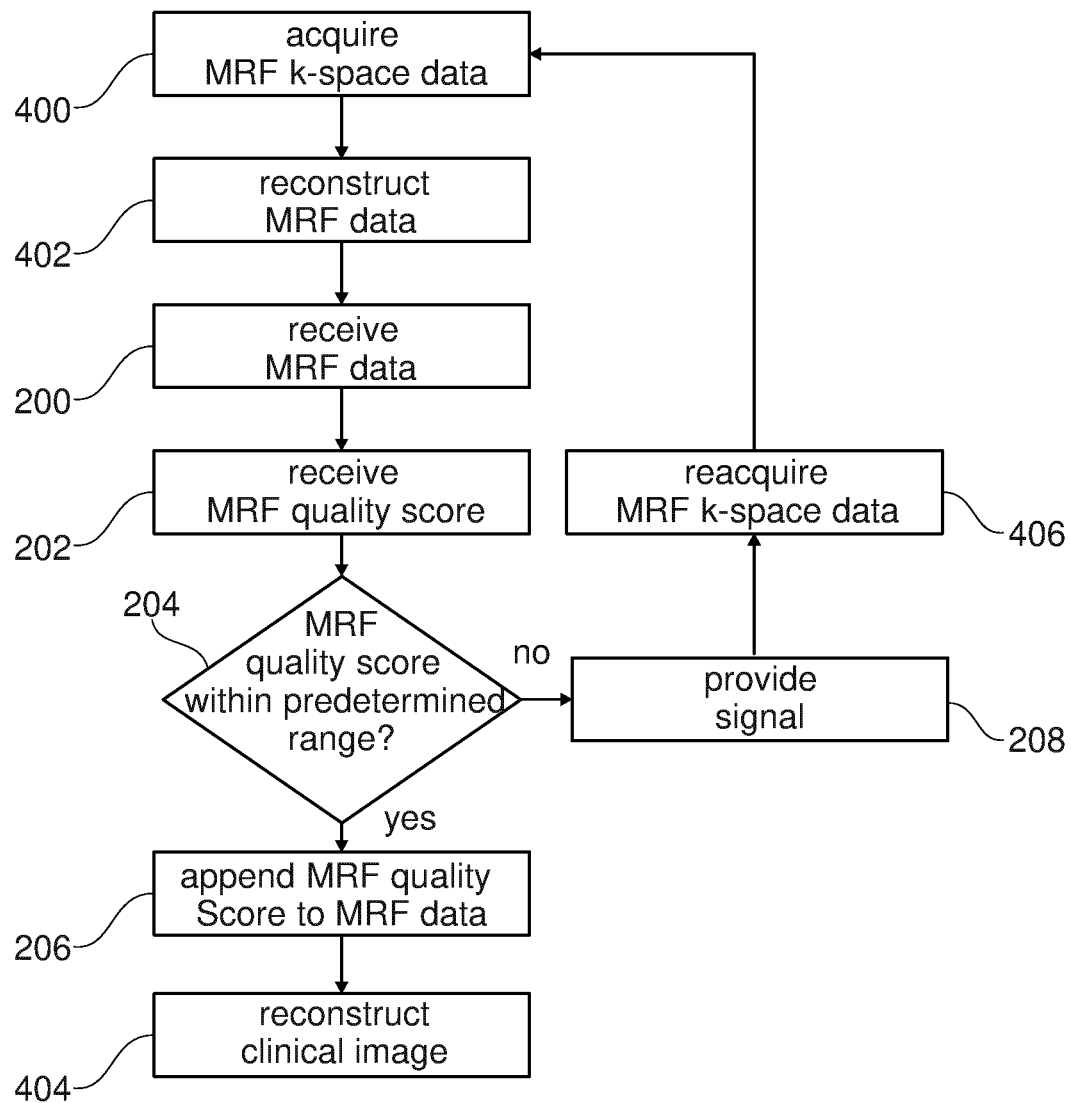
FIG. 4 shows a flow chart which illustrates a method of operating the medical system of FIG. 3.

FIG. 4 shows a flowchart which illustrates one method of operating the medical system 300 of FIG. 3. The method starts with step 400. In step 400 the MRF k-space data 332 is acquired by controlling the magnetic resonance imaging system 302 with the MRF pulse sequence commands 330. Next, in step 402, the MRF data 124 is reconstructed from the MRF k-space data 332. The MRF data 124 is either a sequence of images or a signal that has been reconstructed from this sequence of images for each voxel.

The method in FIG. 4 then proceeds to steps 200 and 202 as was performed in the method illustrated in FIG. 2. Next, the method proceeds to step 204, which is a decision box with the question "Is the MRF quality score 126 within the predetermined range 128?." If the answer is yes, the method proceeds to step 206 as was illustrated in FIG. 2. After step 206 has been performed step 404 may optionally be performed. In step 404 the clinical MRF image 336 is reconstructed by matching the MRF data 124 to the clinical MRF dictionary 334. Returning back to step 204, if the answer was no, then the method proceeds to step 208 as was illustrated in FIG. 2. After the signal has been provided there are several options. In one example a user interface may be displayed which gives an operator a number of options as to how to proceed. Another option is illustrated with step 406. In step 406 the method returns back to step 400. Essentially the signal causes the magnetic resonance imaging system to reacquire the MRF k-space data 332 and repeat the method.

Processing MRF data can take considerable time and a multitude of quality aspects can be defined that impact the diagnosis. It is therefore difficult to check data quality immediately after data acquisition. The invention proposes an automated quality check of the acquired MRF data, depending on the clinical question and the diagnostic requirements. By implementing the method proposed here, an operator will know immediately if the data quality is insufficient and the data acquisition needs to be repeated.

Furthermore, the scores are stored as metadata with the acquired data set, making it available for post-processing and reviewing purposes.

As was described in the introduction, MR Fingerprinting (MRF) is an acquisition method for multi-parametric quantitative imaging. MRF can captures multiple tissue properties in a single acquisition. The resulting signals are matched against a dictionary of known signals to retrieve the multiple parameters. Different dictionaries or matching techniques may be used for different applications and clinical questions. The size of the dictionary and matching time can grow significantly when a larger number of parameters are encoded. In addition to producing multiple quantitative maps, MRF can be used to generate synthetic conventional image contrasts, to determine the composition of tissue within a voxel, or to classify tissue types.

In conventional MR imaging, a single contrast-weighted image or parameter map is derived from each measurement. The resulting image is usually computed directly and shown to the operator, so that image quality can be checked immediately. Further, in many cases a conventional MR contrast serves a specific diagnostic purpose (for example, a T1-weighted image within a specific protocol may be used for observing the anatomy, while a diffusion-weighted image may be used to identify physiological properties of tissue).

Since MRF encodes multiple parameters at once and there is a multitude of options how to analyze and present the acquired data, it is more difficult for the operator to decide if the quality of the acquired data is sufficient for all diagnostic purposes. Especially junior or less trained technologists may have difficulties estimating the data quality. Furthermore, some analysis techniques, such as multi-compartment analysis, can take a considerable calculation time, so that an immediate feedback is not always possible.

Examples may overcome these problems by implementation of an automated quality check (via the MRF scoring module 122) of the acquired MRF data 124, depending on the clinical question (MRF scoring module configuration command) and the diagnostic requirements. By implementing the method proposed here, an operator could know immediately if the image quality is insufficient and the data acquisition needs to be repeated.

Furthermore, the scores (MRF quality score 126) are stored as metadata (annotated MRF data 130) with the acquired data set (MRF data 124), making it available for post-processing and reviewing purposes. Examples may contain one or more of the following features:

(B) Matching the MRF data to a small dictionary that is not sufficiently resolved for diagnostics but still delivers insights into quality aspects (C) Retrieving phase information from the MRF image series The following table lists some possible diagnostic aspects and examples of associated quality measures, referring to the above data processing methods (A)-(C).

| Diagnostic aspect | Example for preparation of quality measure | Example quality measure |
| --- | --- | --- |
| Correct choice of image geometry | From (A), use template matching or machine learning to determine the position of the ROI within the imaging volume | Fraction of ROI covered by image or fraction of image covered by ROI (plus margin), whatever value is smaller |
| Motion artifacts that make diagnostically important patterns less visible (this can be several different types) | From (A), use spatial frequency analysis or deep learning approaches to identify prevalence of specific motion artifacts | For each artifact type: 1 if not detectable, <1 if detectable, with lower values being more severe |
| Reliability of quantitative values | From (C), determine regions where large field inhomogeneities may affect the accuracy of the quantitative values. From (A), determine regions where image artifacts are relevant (see above). | Average of reliabilities of all image regions, where for each region 1 means no field fluctuation and no artefact, <0 if values are assumed to be affected by field inhomogeneities or artifacts |
| Noise level or fluctuations of quantitative values | From (B) and with prior knowledge about the parameter range expected for a certain image region, determine quantitative values with high resolution for a restricted value range. | SNR of quantitative parameter averaged over multiple image regions |
| General noise map | Estimated noise from fingerprint signals | Estimated SNR in different image regions |
| Correct range and distribution of quantitative values | From (B), use low-resolution dictionary to produce coarse parameter maps that allow to estimate if the quantitative values in different parts of the image are within the expected range. | Deviation from expected value range or deviation from expected histogram of values |
| Overall reliability of matching results | From (B), determine average or standard deviation of match quality q for all voxel in a certain region. | Average match quality for all voxels that do not contain fluids (i.e. all voxels with T1 below a certain threshold and signal strength above a certain threshold) |

A method to map a pre-defined clinical question (MRF scoring module configuration command) to requirements for quality scores (MRF quality score 126) for different diagnostic aspects For each diagnostic aspect (and each MRF sequence implementation), a definition of a method to estimate a quality score (MRF quality score 126) of acquired data (MRF data comprising the MRF quality score 126)

A method to calculate an overall quality score (MRF quality score 126) and present a proposal to the operator For each diagnostic aspect, a quality measure (algorithm in the MRF scoring module 122) is defined. In some examples, the higher the quality score derived for this measure, the better the quality is considered to be for the corresponding diagnostic aspect. Quality measures are defined in a way that they can be calculated from the acquired MRF data with limited computational effort, so that they can be evaluated immediately after data acquisition.

Data processing methods for quick evaluation of quality include, but are not limited to:
(A) Summing up the complex-valued images of the MRF time series For each clinical question, a number of quality requirements are defined. A quality requirement is the minimum quality score that a specific diagnostic aspect needs to achieve in order to be sufficient for the diagnostic purpose.

Figure 5:
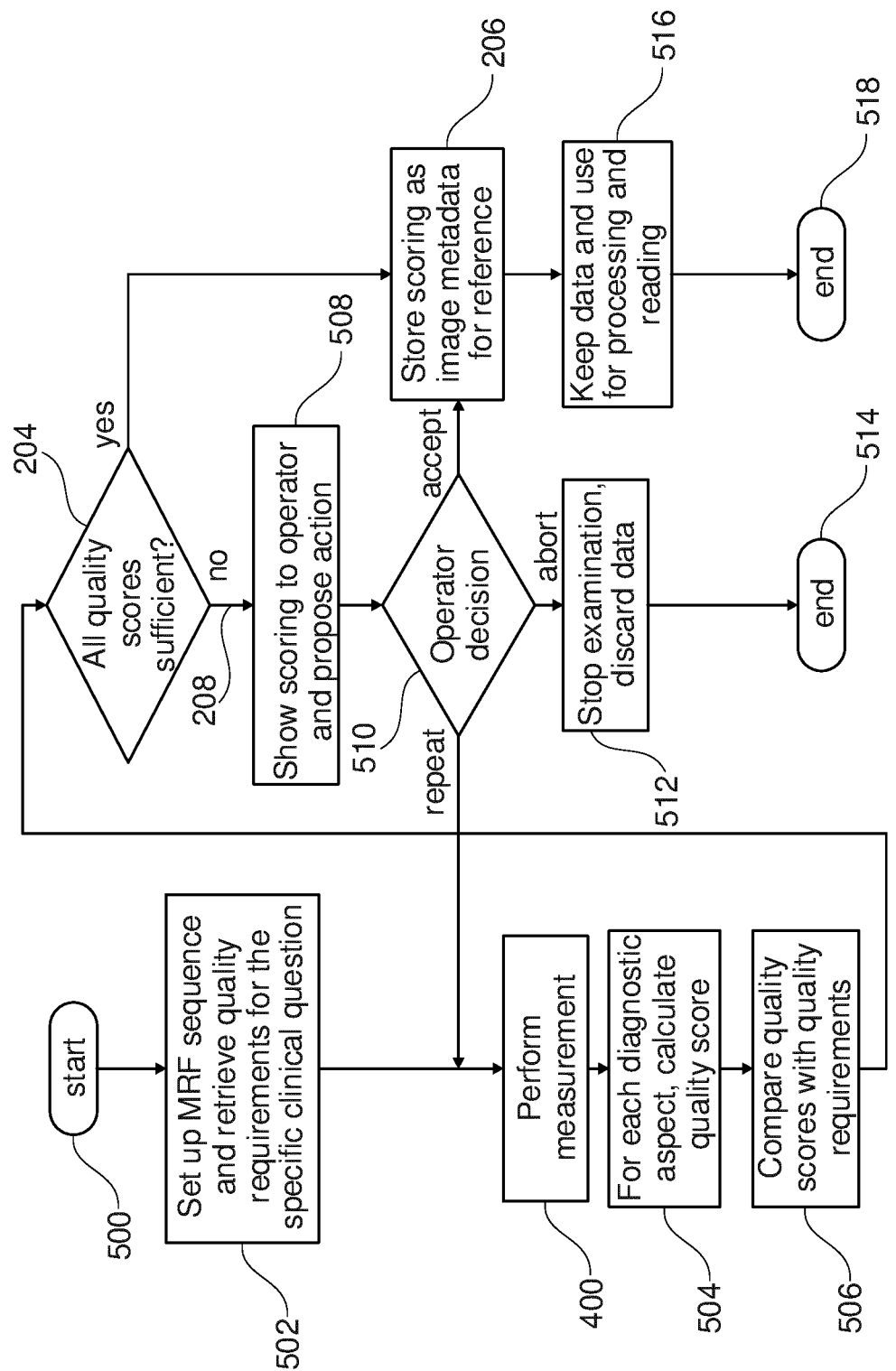
FIG. 5 shows a flow chart which illustrates a further example of a method.

FIG. 5 illustrates a further example of the method. The method starts with start block 500. Next, in step 502, the magnetic resonance fingerprinting sequence is set up and quality requirements for specific clinical questions are retrieved. The method then proceeds to step 400, where the measurement is performed.

Then, in step 504, for each diagnostic aspect a quality score is calculated. For example, the MRF scoring module 122 may have multiple algorithms that it can perform. Then, in step 506, the quality scores are compared with quality requirements. This is equivalent to comparing the MRF quality score 126 to the predetermined range 128. There may be a predetermined range 128 for each individual test that is performed. The method then proceeds to decision box at step 204 and the question is whether all quality scores are sufficient. If the answer is no the method then proceeds to provide a signal and proceeds to step 508, where the scoring is shown to the operator and an action is proposed. In step 510 the operator has a number of decisions.

The operator can choose to repeat and then go to step 400 and repeat the measurement. In other cases, the operator can abort the measurement and proceed to step 512, where the examination is stopped and the data is discarded. After step 512 the method proceeds to step 514, where the method ends. Returning back to step 510, the operator can also decide to accept that the quality score is insufficient and the method proceeds to step 206, where the MRF quality score 126 is stored as meta data with the image or MRF data 124 for further reference. The method then proceeds to step 516 where the data is kept and used for processing and reading. After step 516 the method proceeds to step 518 where the method ends. Returning back to step 204, if all the quality scores are sufficient then the method proceeds to step 206 and then steps 206, 516 and 518 proceed as was previously described.

An overview of the methods illustrated in FIG. 5 is:

The MRF sequence is set up and the quality requirements for the clinical question are retrieved.

A measurement is performed and quality scores for the different diagnostic aspects are calculated.

The quality scores are compared with the respective quality requirements.

If all quality scores are sufficient, store them as metadata with the images and continue processing If not all quality scores are sufficient, provide the operator with information about the scores and ask for decision The operator may decide to repeat the measurement, stop the examination, or accept the images in spite of insufficient quality By storing the quality scores as metadata with the images, a later search for images with specific quality scores becomes possible. Furthermore, when processing of the MRF data in different ways at a later time (e.g. dictionary matching, creation of synthetic contrasts, multi-compartment analysis), the available quality scores can serve as an indication if the selected processing method can deliver useful results.

In another example, the described method is used for data acquisition methods other that MR Fingerprinting that produce multiple contrasts, require long computation times, or are difficult to evaluate by technologists.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

REFERENCE SIGNS LIST 100 medical system
102 computer
104 hardware interface
106 computational system
108 user interface
110 memory
120 machine executable instructions
122 MRF scoring module
124 MRF data
126 MRF quality score
128 predetermined range
130 annotated MRF data
132 signal
200 receive the MRF data
202 receive the MRF quality score in response to inputting the MRF data into an MRF scoring module
204 append the MRF quality score to the MRF data if the MRF quality score is within a predetermined range
206 Is the MRF quality score within the predetermined range?
208 provide a signal if the MRF quality score is outside of the predetermined range
300 medical system
302 magnetic resonance imaging system
304 magnet
306 bore of magnet
308 imaging zone
310 region of interest
312 magnetic field gradient coils
314 magnetic field gradient coil power supply
316 radio-frequency coil
318 transceiver
320 subject
322 subject support
330 MRF pulse sequence commands
332 MRF k-space data
334 clinical MRF dictionary
336 clinical MRF image
400 acquire MRF k-space data by controlling the magnetic resonance imaging system with the MRF pulse sequence commands
402 reconstruct the MRF data from the MRP k-space data
500 start
502 Set up MRF sequence and retrieve quality requirements for the specific clinical question
504 for each diagnostic aspect, calculate quality score
506 compare quality scores with quality requirement
508 show scoring to operator and propose action
510 operator decision
512 stop examination, discard data
514 end
516 keep data and use for processing and reading
518 end

The invention claimed is:

1. A medical system comprising:
a processor;
a memory configured to contain machine executable instructions and an MRF scoring module, wherein the MRF scoring module is configured to output an MRF quality score in response to receiving MRF data reconstructed from MRF k-space data as input;
wherein
the memory further contains MRF pulse sequence commands configured to acquire the said MRF k-space data according to an MRF magnetic resonance imaging protocol, wherein execution of the machine executable instructions further causes the processor to:

acquire MRF k-space data by controlling the magnetic resonance imaging system with the MRF pulse sequence commands; and a computational system configured to control the medical system, wherein execution of the machine executable instructions causes the computational system to:

receive the MRF k-space data;

receive the MRF quality score in response to inputting the MRF k-space data into an MRF scoring module prior to reconstruction;

append the MRF quality score to the MRF k-space data if the MRF quality score is within a predetermined range; and provide a signal if the MRF quality score is outside of the predetermined range and arrange to reconstruct the MRF data from the MRF k-space data wherein the MRF data comprises a series of complex valued images, wherein the MRF scoring module is configured to:

construct a composite image by summing the series of complex valued image, and provide the MRF quality score using the composite image.

2. The medical system of claim 1, wherein the MRF scoring module is further configured to perform at least one of the following:

provide the MRF quality score by identifying motion artifact regions in the composite image; or provide the MRF quality score by identifying a desired region of interest within the composite image.

3. The medical system of claim 2, wherein the MRF data comprises phase encoding, wherein the MRF scoring module is configured to:

calculate a magnetic field inhomogeneity map from the phase encoding of the MRF data;

determine inhomogeneous B0 field regions by thresholding the magnetic field inhomogeneity map; and provide the MRF quality score by correlating the inhomogeneous B0 field regions with the motion artifact regions.

4. The medical system of claim 1, wherein the memory comprises an initial MRF dictionary, wherein the MRF scoring module is configured to:

reconstruct an initial MRF image by matching the MRF data to the initial MRF dictionary according to an initial MRF reconstruction algorithm; and provide the MRF quality score using the initial MRF image.

5. The medical system of claim 4, wherein the MRF scoring module is further configured to perform at least one of the following:

provide the MRF quality score by restricting the reconstruction of the initial MRF image to a predetermined parameter range and calculating an average signal to noise range from the initial MRF image; or provide the MRF quality score by calculating an estimate of parameter values within predetermined regions of the initial MRF image.

6. The medical system of claim 1, wherein the memory further comprises a chosen MRF dictionary with multiple dictionary entries, wherein the wherein MRF scoring module is configured to:

compute an inner product between the MRF signal for each voxel and each of the multiple dictionary entries; and provide the MRF quality score using the inner product.

7. The medical system of claim 1, wherein the wherein MRF scoring module is configured to provide the MRF quality score as a signal to noise estimate calculated by applying a statistical measure to predetermined regions of the MRF data.

8. The medical system of claim 1, wherein execution of the machine executable instructions further causes the computational system to:

receive an MRF scoring module configuration command with the MRF data; and configure an operational mode of the MRF scoring module using the MRF scoring module configuration command.

9. The medical system of claim 1, wherein the medical system comprises a user interface, wherein the signal is provided by the user interface.

10. A medical system comprising:

a processor;

a memory configured to contain machine executable instructions and an MRF scoring module, wherein the MRF scoring module is configured to output an MRF quality score in response to receiving MRF data reconstructed from MRF k-space data as input;

wherein the memory further contains MRF pulse sequence commands configured to acquire the said MRF k-space data according to an MRF magnetic resonance imaging protocol, wherein execution of the machine executable instructions causes the processor to:

acquire MRF k-space data by controlling the magnetic resonance imaging system with the MRF pulse sequence commands; and a computational system configured to control the medical system, wherein execution of the machine executable instructions causes the computational system to:

receive the MRF k-space data;

receive the MRF quality score in response to inputting the MRF k-space data into an MRF scoring module prior to reconstruction;

append the MRF quality score to the MRF k-space data if the MRF quality score is within a predetermined range; and provide a signal if the MRF quality score is outside of the predetermined range and;

arrange to reconstruct the MRF data from the MRF k-space data; wherein the memory comprises an initial MRF dictionary, wherein execution of the machine executable instructions further causes the processor to:

the MRF scoring module is configured to:

reconstruct an initial MRF image by matching the MRF data to the initial MRF dictionary according to an initial MRF reconstruction algorithm; and provide the MRF quality score using the initial MRF image.

11. The medical system of claim 10, wherein the execution of the machine executable instructions causes the processor to perform at least one of the following:

provide the MRF quality score by identifying motion artifact regions in the composite image; or provide the MRF quality score by identifying a desired region of interest within the composite image.

12. The medical system of claim 11, wherein the MRF data comprises phase encoding, and the execution of the machine executable instructions causes the processor to:

calculate a magnetic field inhomogeneity map from the phase encoding of the MRF data;

determine inhomogeneous B0 field regions by thresholding the magnetic field inhomogeneity map; and
provide the MRF quality score by correlating the inhomogeneous B0 field regions with the motion artifact regions.

13. The medical system of claim 10, wherein the memory comprises an initial MRF dictionary, and the execution of the machine executable instructions further causes the processor to:
reconstruct an initial MRF image by matching the MRF data to the initial MRF dictionary according to an initial MRF reconstruction algorithm; and
provide the MRF quality score using the initial MRF image.

14. The medical system of claim 13, wherein the execution of the machine executable instructions further causes the processor to perform at least one of the following:
provide the MRF quality score by restricting the reconstruction of the initial MRF image to a predetermined parameter range and calculating an average signal to noise range from the initial MRF image; or
provide the MRF quality score by calculating an estimate of parameter values within predetermined regions of the initial MRF image.

15. The medical system of claim 10, wherein the memory further comprises a chosen MRF dictionary with multiple dictionary entries, and execution of the machine executable instructions causes the processor to:
compute an inner product between the MRF signal for each voxel and each of the multiple dictionary entries; and
provide the MRF quality score using the inner product.

16. A method of medical imaging, wherein the method comprises:
receiving MRF data;
receiving a MRF quality score prior to reconstruction in response to inputting the MRF data into an MRF scoring module, wherein the MRF scoring module is configured to output an MRF quality score in response to receiving MRF data as input;
appending the MRF quality score to the MRF data if the MRF quality score is within a predetermined range; and
providing a signal if the MRF quality score is outside of the predetermined range;
providing a memory comprising an initial MRF dictionary, wherein the MRF scoring module is configured to:
reconstruct an initial MRF image by matching the MRF data to the initial MRF dictionary according to an initial MRF reconstruction algorithm; and
providing the MRF quality score using the initial MRF image.

17. The method of claim 16, wherein the method further comprises:
providing the MRF quality score by identifying motion artifact regions in the composite image; or
providing the MRF quality score by identifying a desired region of interest within the composite image.

18. The method of claim 17, wherein the method further comprises:
calculating a magnetic field inhomogeneity map from the phase encoding of the MRF data;
determining inhomogeneous B0 field regions by thresholding the magnetic field inhomogeneity map; and
providing the MRF quality score by correlating the inhomogeneous B0 field regions with the motion artifact regions.

19. The method of claim 16, wherein the method further comprises:
providing the MRF quality score as a signal to noise estimate calculated by applying a statistical measure to predetermined regions of the MRF data.

* * * * *